(12) United States Patent
Coronel et al.

(10) Patent No.: US 6,342,452 B1
(45) Date of Patent: Jan. 29, 2002

(54) METHOD OF FABRICATING A SI3N4/POLYCIDE STRUCTURE USING A DIELECTRIC SACRIFICIAL LAYER AS A MASK

(75) Inventors: Philippe Coronel, Massy; Pascal Costaganna, Chailly-en-Biere; Lars Heineck, Paris, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/573,352

(22) Filed: May 18, 2000

(30) Foreign Application Priority Data

May 20, 1999 (EP) .............................. 99480038

(51) Int. Cl.⁷ ......................................... H01L 21/3065
(52) U.S. Cl. ..................... 438/710; 438/532; 438/533; 438/715; 438/717; 438/719; 438/721
(58) Field of Search ................. 438/710, 715, 438/717, 719, 721, 725, 532, 533

(56) References Cited

U.S. PATENT DOCUMENTS

| | | | |
|---|---|---|---|
| 5,872,385 A | * 2/1999 | Taft et al. | 257/437 |
| 6,100,559 A | * 8/2000 | Park | 257/315 |
| 6,121,125 A | * 9/2000 | Lee | 438/592 |
| 6,197,672 B1 | * 3/2001 | Lin et al. | 438/592 |
| 6,284,633 B1 | * 9/2001 | Nagabushnam et al. | 438/585 |

* cited by examiner

Primary Examiner—Benjamin L. Utech
Assistant Examiner—Binh X. Tran
(74) Attorney, Agent, or Firm—Daryl K. Neff; Todd M. C. Li (57) ABSTRACT

According to the disclosed method, there is provided a structure consisting of a silicon substrate coated with a bottom thin SiO2 layer, a doped polysilicon layer, a refractory metal layer and a top Si3N4 capping layer. Said refractory metal and doped polysilicon layers will form a polycide layer under subsequent thermal treatments. First, a sacrificial layer of a dielectric material such as oxynitride is deposited onto the structure. Oxynitride is impervious to UV radiation and has excellent conformal properties. Then, a layer of a photoresist material is deposited onto the structure and patterned to form a mask. Now the dielectric and top Si3N4 layers are anisotropically etched using the photoresist mask. The mask is stripped and the refractory metal and doped polysilicon layers are anisotropically dry etched down to the SiO2 layer using the patterned dielectric layer as an in-situ hard mask. A conformal layer of Si3N4 is deposited onto the structure, then anisotropically dry etched until the thin SiO2 layer is exposed to form the Si3N4 spacers. Diffusion regions are formed in the substrate by ion implantation. A layer of BPSG is deposited onto the structure and planarized. Contact holes are formed to expose said diffusion regions and filled with a metal to create borderless metal contacts therewith.

10 Claims, 4 Drawing Sheets

METHOD OF FABRICATING A SI3N4/POLYCIDE STRUCTURE USING A DIELECTRIC SACRIFICIAL LAYER AS A MASK

FIELD OF INVENTION

The present invention relates to the manufacture of semiconductor integrated circuits and more particularly to an improved method of forming a composite Si3N4/polycide structure laterally coated with a Si3N4 spacer that has a low aspect ratio. Typically, such a composite structure consists of a top silicon nitride (Si3N4) layer, an intermediate refractory metal silicide layer (e.g. WSix) and a bottom doped polycrystalline silicon (polysilicon) layer. The deposition of a refractory metal silicide over a layer of doped polysilicon is extensively used in the semiconductor industry, forming a so-called polycide layer. The above method finds a valuable application in the fabrication of borderless metal contacts.

BACKGROUND OF THE INVENTION

In the manufacture of such advanced semiconductor IC's, particularly in dynamic random access memory (DRAM) chips, insulated gate field effect transistors (IGFETs) are extensively used. In a particular implementation commonly found in 16/64 Mbit DRAM chips, each individual memory cell is comprised of an IGFET and a storage capacitor. A composite Si3N4/polycide structure can be found above a silicon substrate coated with a thin SiO2 gate layer to form the gate conductor of the IGFET as known for those skilled in the art. The gate conductor formation which requires the step of etching such a Si3N4 dielectric/polycide structure is essential in the fabrication of the borderless metal contact with a diffusion (source/drain) region of the IGFETs. The borderless metal contact fabrication will be now briefly described by reference to FIGS. 1A–1F.

Figure 1A:
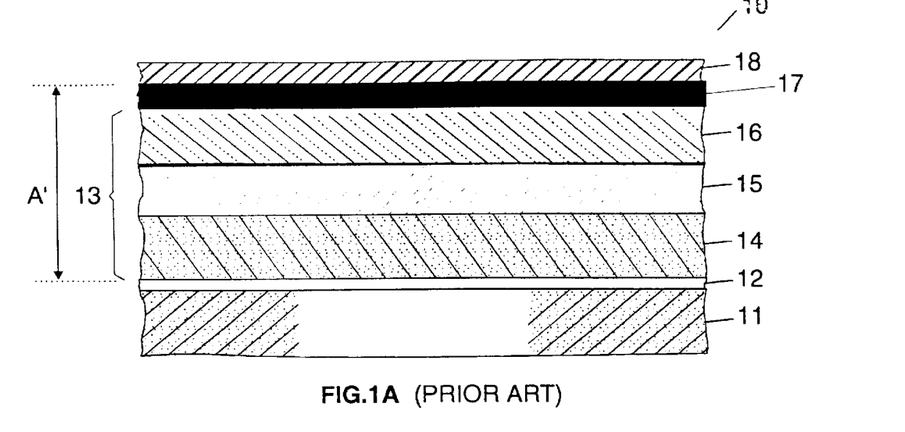
FIGS. 1A to 1F schematically show a semiconductor structure undergoing the borderless metal contact fabrication process which includes the conventional GC stack formation step sequence.

FIG. 1A schematically shows a portion of a semiconductor wafer at the initial stage of the borderless metal contact fabrication. In FIG. 1A, there is shown a conventional semiconductor structure 10 comprising a silicon substrate 11 coated by a thin 8.5 nm silicon oxide (SiO2) layer 12 (the gate dielectric of the IGFETs) with the gate conductor (GC) stack 13 formed thereon. The GC stack 13 typically consists of a plurality of layers that are superposed: a bottom 150 nm thick arsenic doped polysilicon layer 14, an intermediate 120 nm thick tungsten silicide (WSix) layer 15, and a 410 nm thick silicon nitride (Si3N4) capping layer 16. The Si3N4 capping layer 16 and the combined WSix/doped polysilicon materials of layers 15 and 14 thus form the dielectric/polycide structure mentioned above. Finally, a bottom anti-reflective layer, referred to hereafter as the BARL layer 17 and a photoresist layer 18 terminate the layered structure shown in FIG. 1A. The BARL layer 17 thickness is typically of about 90 nm. As apparent in FIG. 1A, the thickness of stacked layers 14 to 17 is represented by parameter A'.

The GC stack 13 delineation process starts with the patterning of the photoresist layer 18 to produce the desired mask which will subsequently be used to transfer the desired pattern fixed in the resist mask to the underlying layers. To that end, the photoresist layer 18 is exposed, baked and developed as standard. The BARL and the Si3N4 materials of layers 17 and 16 are dry etched in sequence in the same tool. A CF4/CHF3/O2/Ar chemistry and an AME P5000 RIE etcher manufactured by Applied Materials, Santa Clara, Calif., USA are adequate for that step. The etch process is monitored through an optical etch end point system as standard.

The etch operating conditions are:

| | |
|---|---|
| Ar flow | 16 sccm |
| CF4 flow | 120 sccm |
| CHF3 flow | 45 sccm |
| O2 flow | 7.5 sccm |
| Pressure | 160 mTorr |
| RF freguency | 13.56 Mhz |
| Bias power | 870 Watt |
| Magnetic Field | 30 Gauss |
| Duration | 50 s (BARL) |
| | 110 s (Si3N4) | wherein "sccm" denotes standard cubic centimeters per minute.

Figure 1B:
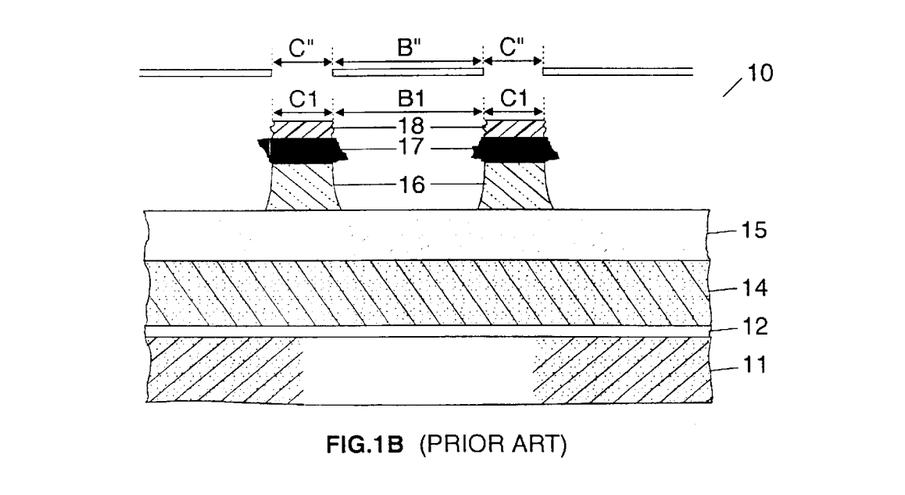

The resulting structure is shown in FIG. 1B. Now turning to FIG. 1B, the dimensions of GC stacks and spaces therebetween is represented by C1 and B1 respectively. The dimensions of C1 and B1 are derived from the dimensions C" and B" of the physical mask used for the resist layer 18 exposition. As further apparent in FIG. 1B, the resist layer 18 lateral profile exhibits typical dimensional swings forming the undulations depicted therein. This defect induces polymer residues on the BARL layer 17 sidewall, which in turn creates a "foot" at the base of Si3N4 layer 16.

Now, the BARL layer 17 and the photoresist mask 18 are stripped by ashing in ozone and structure 10 is cleaned as standard.

The next step consists in transferring the pattern into the underlying WSix layer 15 using the remaining part of the Si3N4 capping layer 16, referred to hereinbelow as the Si3N4 cap 16, as an in-situ hard mask. This step is monitored by an optical etch end point system to detect the WSix layer 15/doped polysilicon layer 14 interface. This process uses a Cl2/HCl/O2 chemistry with a LAM TCP 9400 plasma etcher, an equipment sold by LAM RESEARCH Corp., Fremont, Calif., USA.

The operating conditions are:

| | |
|---|---|
| Cl2 flow | 60 sccm |
| HCL flow | 120 sccm |
| O2 flow | 8 sccm |
| Pressure | 5 mTorr |
| RF frequency | 13.56 Mhz |
| TCP power | 400 Watt |
| Bias power | 105 Watt |

Next, the doped polysilicon layer 14 is etched in the same RIE etcher without stopping plasma discharge. The mixture is now reduced to the Cl2 and O2 compounds. This composition change aims to increase selectivity between doped polysilicon and SiO2 in order to preserve SiO2 gate layer 12 integrity. The etch operating conditions becomes:

| | |
|---|---|
| Cl2 flow | 20 sccm |
| O2 flow | 3 sccm |
| He flow | 100 sccm |
| Pressure | 15 mTorr |
| RF frequency | 13.56 Mhz |
| TCP power | 200 Watt |
| Bias power | 35 Watt |

This step is monitored by an optical etch end point system to detect the doped polysilicon layer 14 /SiO2 layer 12 interface.

Figure 1C:
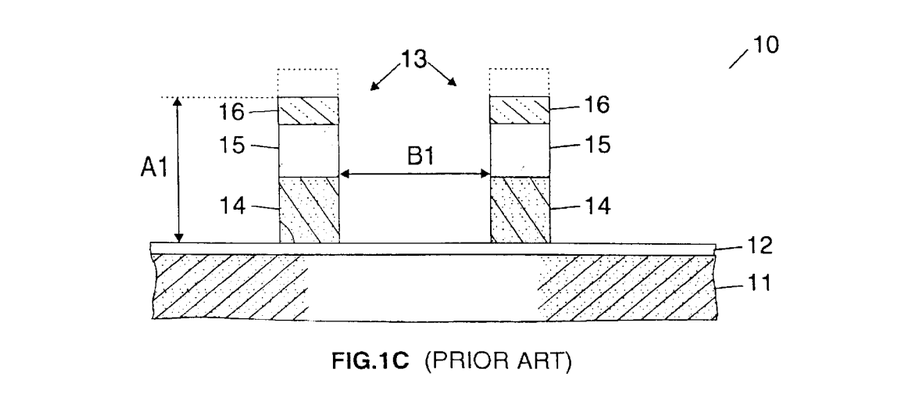

An overetch is performed during a fixed time (60 seconds) in order to eliminate polysilicon residuals without affecting the integrity of the SiO2 material of the thin gate dielectric layer 12. At this stage of the fabrication process, the structure 10 is shown in FIG. 1C. Because the chemistry used to etch the WSix layer 15 is very aggressive, a non negligible part of the Si3N4 cap 16 is consumed during this step. This erosion which is visible in FIG. 1C, reduces the GC stack 13 height which is indicated by reference A1 in FIG. 1C. The wafer is cleaned in a DHF solution as standard to remove the SiOx residuals formed on the SiO2 gate layer 12 and on the GC stack sidewall during the previous etch step in order to adjust the profile topography. As apparent in FIG. 1C. the remaining portions of the GC stack now have the general shape of lines, but are still indicated by reference numeral 13.

The borderless contact to diffusion fabrication process continues with the formation of Si3N4 spacers coating the lateral sides of the GC stacks 13 for sidewall protection. The material deposited has the same nature as the Si3N4 used for capping the GC stacks 13. To that end, a 60 nm thick Si3N4 layer is conformally deposited by low pressure chemical vapor deposition (LPCVD) onto the structure 10 and anisotropically etched in an RIE reactor to form Si3N4 spacers referenced 19 in FIG. 1D. An optical etch end point system is used to detect the SiO2 gate layer 12 exposure as standard. A diffusion (source/drain) region 20 of the IGFET is then formed by ion implantation in desired locations as standard. At this stage of the GC stack fabrication process, the structure is shown in FIG. 1D.

Figure 1D:
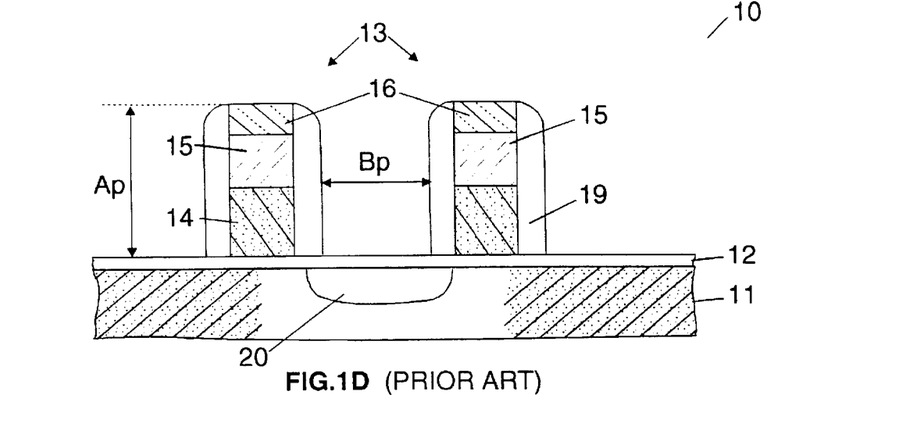

Still referring to FIG. 1D, the Ap parameter which measures the GC stack 13 height is obtained after a succession of processing steps. As a matter of fact, the GC stack initial height A' is reduced to a value A1 after the WSix layer 15 etching which has caused a significant consumption of the material of Si3N4 cap 16 (due to the use of a non-selective chemistry) and then further reduced to a value Ap because of the overetch of Si3N4 spacer 19. Now, if we consider the Bp parameter which is the width between two GC stacks 13 coated with the Si3N4 spacer 19, it is very dependent on the thickness of spacer 19 and the overetch. Parameter Bp is first determined by parameter B'' (i.e. the mask design, see FIG. 1B) which becomes B1 after the Si3N4 cap layer 16 and polycide layer 14/15 etching (due to etch bias), and DHF cleaning (with passivation removal). Finally, after Si3N4 spacer 19 fabrication B1 becomes Bp. It is important to point out that the illustrations in the drawings are not necessarily drawn to scale; in reality parameter Ap is usually much greater than parameter Bp.

Figure 1E:
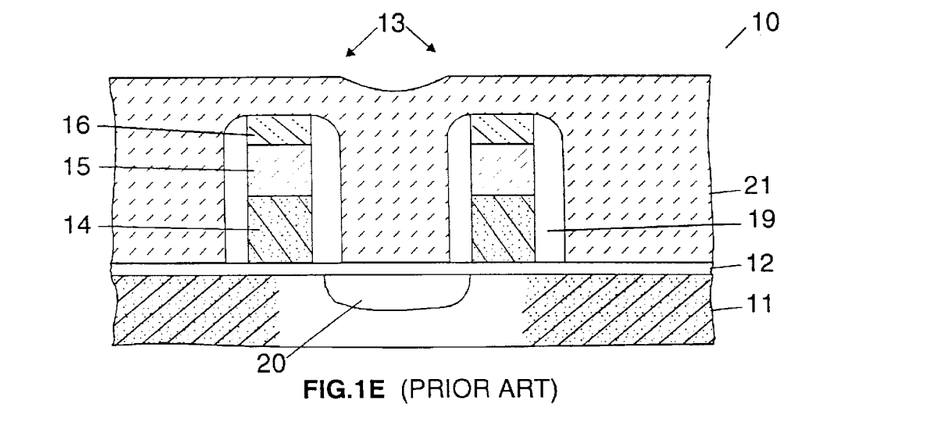

A 2100 nm thick layer 21 of BPSG is blanket deposited by plasma enhanced chemical vapor deposition (PECVD) onto the FIG. 1D structure 10. The BPSG material forming layer 21 has the double role of an insulating and planarizing medium. However, because the BPSG layer surface is not perfectly planar, a chemical-mechanical polishing (CMP) step is required to get a mirror-like surface and reduce the BPSG layer thickness to 1400 nm. At this stage of the GC stack fabrication process, the resulting structure is shown in FIG. 1E. As apparent in FIG. 1E, the BPSG layer 21 presents a cusp at its top surface between to adjacent GC stacks 13 which is caused by the well-known dishing effect.

A photolithography step is performed in order to define the contact opening locations in a resist mask. Using this mask, the BPSG layer 21 and the SiO2 gate layer 12 are etched in a two-step sequence to expose the silicon substrate 11 at diffusion region 20 locations. The diffusion region 20 may already be in place, or it may be defined, for example, by ion implantation performed after such etch. To that end, a TEL 85 SDRM, a RIE etcher manufactured by TOKYO ELECTRON Ltd, Tokyo, JA is adequate with the operations conditions recited below.

| first sub-step | |
|---|---|
| C4F8 flow | 10 sccm |
| CO flow | 50 sccm |
| Ar flow | 200 sccm |
| O2 flow | 5 sccm |
| Pressure | 40 mtorr |
| RF frequency | 13.56 Mhz |
| Bias power | 1400 watt |
| Duration | 1 min |

| second sub-step | |
|---|---|
| C4F8 flow | 14 sccm |
| CO flow | 300 sccm |
| Ar flow | 380 sccm |
| Pressure | 57 mtorr |
| RF frequency | 13.56 Mhz |
| Power | 1700 Watt |
| Duration | 2 min 40 |

Then, a 25 nm thick dual adhesion layer of titanium/titanium nitride (Ti/TiN) forming a liner is deposited onto the wafer by sputtering. This is followed by the blanket deposition of a tungsten (W) layer by chemical vapor deposition (CVD) to fill contact openings to form metal contacts referenced 22 in FIG. 1F. Next, the wafer is chem-mech polished with an adequate slurry to remove the tungsten and titanium/titanium nitride in excess.

The initial part of forming the GC stack 13 in this borderless metal contact fabrication process which is described by reference to FIGS. 1A–1C is more detailed in the Int. Appl. published under the PCT bearing NO W096/27899. The only noticeable change is that Si3N4 has replaced the SiO2 material as the stack top layer 16. As a matter of fact, Si3N4 is now preferred because it has a higher selectivity than SiO2 with respect to the BPSG material forming layer 21 which is used for the contact opening formation. With the continuous trend towards integration density increase, the BPSG material reveals to be an essential element to reach the small dimensions and/or high aspect ratios that are now required in advanced ICs. In particular, the BPSG materials allows to totally fill the space between two GC stacks 13 without any void, as apparent in FIG. 1E, thanks to its high pouring capability.

Figure 1F:
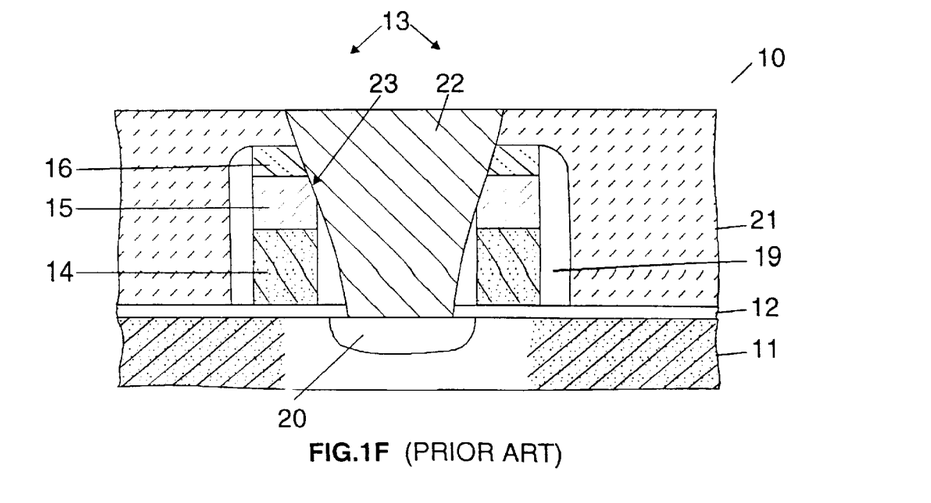

Now turning to FIG. 1F, the erosion of the Si3N4 cap 16 produced during the step of etching the WSix material of layer 15 (see FIG. 1C), causes some areas of the remaining portions of this layer to be exposed at locations 23 during the contact opening formation. As a result, there is produced an electrical short between the borderless contact 22 and the WSix material of the GC stack 13 at these locations, making thereby the corresponding IGFETs inoperative.

On the other hand, to perform an electrical contact with diffusion region 20 between two GC stacks 13 and taking into account that Bp parameter (the width between two GC stacks 13 along the X-axis is small compared to Ap parameter (the height of the GC stack 13 along the Y-axis), etch time must be long enough to reach the substrate 11. The longer the etch time becomes, the larger the contact opening becomes and thus, the wider the contact opening becomes at the top of the GC stack 13. As this contact opening becomes higher it induces a significant erosion of Si3N4 cap 16. As a result, the Ap parameter is variable across the wafer due to the topography and in particular above the shallow trench isolation (STI) regions.

Spacer etching and overetch are important because they affect the A1 and B1 parameters, and thus the Ap and Bp parameters due to the non-selective etching of the Si3N4 materials of the capping layer 16 and spacer layer 19 which have the same stoichiometry. This lack of selectivity induce mask erosion and reduces Si3N4 cap 16 thickness after spacer 19 formation as mentioned above.

During the photolithography process which defines the desired pattern in photoresist layer 18, standing waves are created along the resist lines, leaving undulations on their lateral sides (see FIG. 1B) which are uncontrollable from wafer to wafer and lot to lot). As a consequence, polymer residuals are produced at the bottom of the BARL lines which in turn cause said "foot" at the Si3N4 lines bottoms that are very detrimental to an accurate C1 dimension control.

Ap and Bp parameters defined the aspect ration factor AR such as AR=Ap/Bp. Factor AR is a key feature because at contact opening through the BPSG layer 21 (FIG. 1F), if Ap is much greater than Bp, the contact opening size is widened with a serious risk of electrical shorts between the WSix of layer 15 and the metal contact 22. The challenge is on the Ap parameter because more device integration involves a gate stack height reduction and a requirement to keep Ap as uniform as possible. The Bp parameter is defined by the mask design and the ground rule specifications and finally it determines the width of the GC stack 13, and thus the speed of the IGFETs. To improve process integration for advanced products requires a low aspect ratio factor AR for IGFETs and metal interconnects fabrication. Therefore, these parameters Ap and Bp must obviously be as reproducible as possible.

OBJECTS OF THE INVENTION

It is therefore a primary object of the present invention to provide an improved method of fabricating a composite Si3N4/polycide structure laterally coated with a Si3N4 spacer that uses a dielectric sacrificial layer as an in-situ hard mask.

It is another object of the present invention to provide an improved method of fabricating a composite Si3N4/polycide structure laterally coated with a Si3N4 spacer that has a low aspect ratio factor AR with reproducible values across the wafer.

It is another object of the present invention to provide an improved method of fabricating a composite Si3N4/polycide structure laterally coated with a Si3N4 spacer that permits a significant reduction of the structure height and a better dimensional control thereof.

It is another object of the present invention to provide an improved method of fabricating a composite Si3N4/polycide structure laterally coated with a Si3N4 spacer which relies upon the use of a dielectric material that is conformal and impervious to UV radiation.

It is still another object of the present invention to provide an improved method of fabricating a composite Si3N4/polycide structure laterally coated with a Si3N4 spacer wherein the dielectric has an inorganic nature and a stoichiometry close to the Si3N4 material.

It is still another further object of the present invention to provide an improved method of fabricating a composite Si3N4/polycide structure laterally coated with a Si3N4 spacer wherein the dielectric is oxynitride.

It is still another further object of the present invention to provide an improved method of fabricating a composite Si3N4/polycide structure laterally coated with a Si3N4 spacer wherein the dielectric is oxynitride, a material close enough to Si3N4 to allow etching of both materials in the same tool in the same run.

It is still another further object of the present invention to provide an improved method of fabricating a composite Si3N4/polycide structure laterally coated with a Si3N4 spacer wherein the dielectric is oxynitride, a material different enough to be used as an etch stop layer vis a vis the Si3N4 material during Si3N4 spacer formation.

It is still another further object of the present invention to provide an improved method of fabricating a composite Si3N4/polycide structure laterally coated with a Si3N4 spacer that finds a valuable application in the fabrication of borderless metal contacts According to the present invention there is described a method of fabricating a composite Si3N4/polycide structure laterally coated with a Si3N4 spacer having a low aspect ratio comprising the steps of:

a) providing a structure consisting of a silicon substrate coated with a bottom thin SiO2 layer, a doped polysilicon layer, a refractory metal layer and a top Si3N4 capping layer; said refractory metal and doped polysilicon layers forming a polycide layer under subsequent thermal treatments;

b) depositing a sacrificial layer of a dielectric material onto the structure, said dielectric material being impervious to UV radiation and having a good conformal property;

c) depositing a layer of a photoresist material onto the structure;

d) patterning said photoresist layer to form a mask;

e) anisotropically dry etching the dielectric and top Si3N4 layers using the photoresist mask;

f) stripping the photoresist mask;

g) anisotropically dry etching the refractory metal and doped polysilicon layers down to the SiO2 layer using the patterned dielectric layer as an in-situ hard mask;

h) depositing a conformal layer of Si3N4, referred to as the Si3N4 spacer layer, onto the structure;

i) anisotropically dry etching the Si3N4 spacer layer until the thin SiO2 layer is exposed to form the Si3N4 spacers;

j) ion implanting dopants into the silicon substrate to create diffusion regions at desired locations;

k) depositing a layer of boro-phospho-silicate-glass (BPSG) onto the structure and planarizing it;

l) forming contact holes to expose said diffusion regions; and, m) filling said contact holes with a metal to create metal contacts with the diffusion regions.

The oxynitride (SixOyNz) material provides an antireflective coating which has the property of lowering the composite Si3N4/polycide structure aspect ratio factor and of improving the dimensional control (CD) thereof all across the wafer with a high reproducibility. As a result, electrical shorts related problems of the conventional borderless metal contact fabrication process are eliminated.

DETAILED DESCRIPTION OF A PREFERRED EMBODIMENT

Applicants' inventors have evidenced that most of the above defects were related to the BARL material.

In essence, the main role of the BARL layer 17 is to absorb all incident light emitted by the photo-stepper in order to avoid refractive light induced by the underlying layers (the WSix material has a high reflectance as all metallic films). In reality, it just only allows to improve GC stacks 13 exposure. In substance, it has been pointed out that the BARL material is not impervious enough to UV light. As a result, standing waves caused by unwanted resist exposure due to reflections on the WSix material are created in the resist layer 18, inducing undulations in the resist lines from wafer to wafer and lot to lot with the attendant disadvantages described above.

In the present case of the conventional borderless contact fabrication, the good planarization property of the BARL is rather a drawback. Because, the BARL layer 17 is not conformal at the structure 10 surface, it induces topology differences all across the wafer (mainly on shallow trench isolation areas). In addition, because of its property to planarize, the BARL layer 17 thickness is variable all across the wafer. This thickness non-uniformity is transferred into the underlying layers (first in the Si3N4 capping layer 16 and then in the WSix layer 15).

Finally, the BARL is an organic material. During Si3N4 cap 16 etching, polymer by-products are produced which are a well-known contamination source.

The inventors have found that dielectric materials such as oxynitride (SixOyNz), silicon nitride (Si3N4) and the like when used in place of the BARL, are able to overcome drawbacks of the BARL. These dielectric materials have good conformal properties which makes them poor planarizing media, in contrast to BARL. These materials are also good electrical insulators, and are inorganic. Moreover, these materials unexpectedly have interesting additional characteristics when used as a sacrificial film for patterning the GC stacks 13. The goal is to use a sacrificial film which has an index of refraction close to the Si3N4 material which is used for the cap of the GC stacks and the spacers and which is at least relatively close to that of the SiO2.

As a consequence of their properties, these dielectric materials are advantageously applied to the above described borderless contact fabrication process. They significantly improve the control of the critical dimensions of IGFETs and the GC stack thickness uniformity all across the wafer. Moreover, they allow better subsequent BPSG deposition and dishing effect reduction during the BPSG chemical-mechanical polishing (see FIG. 1E), and can allow a larger process window.

Figure 2A:
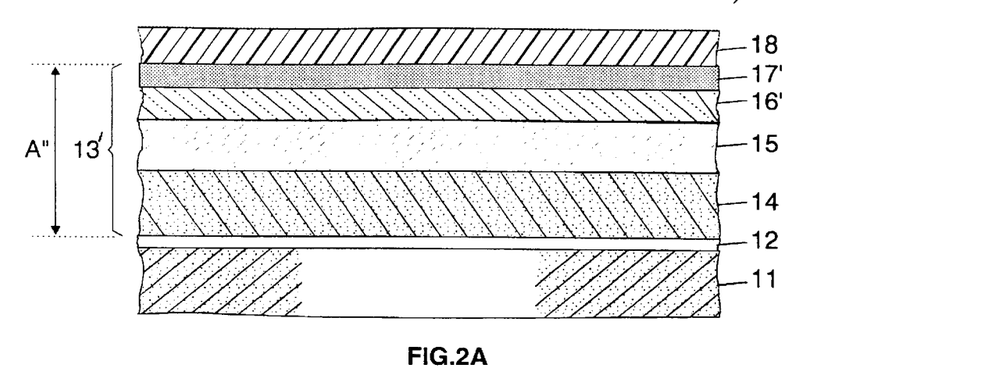
FIGS. 2A to 2F show a semiconductor structure undergoing the same borderless metal contact fabrication process but wherein the GC stack formation step sequence is performed according to the present invention.

A new process according to the present invention will be described by reference to FIGS. 2A–2F. The fabrication of the semiconductor structure referenced 10' shown in FIG. 2A is quite similar to the one of FIG. 1A, except in that the thickness of the Si3N4 layer now referenced 16' is approximately half of Si3N4 layer 16 thickness and the BARL layer 17 is now replaced by an oxynitride layer 17'. The latter change is an essential feature of the method of the present invention.

Oxynitride is the preferred dielectric material because of its ideal stoichiometry. The oxynitride behavior is defined by parameters N (refractive index) which is related to the amount of the light diffracted by the underlying materials (WSix, . . . ) and K (extinction coefficient) which describes its ability to absorb light. Taking into account these parameters, the oxynitride film thickness has been evaluated as a function of all the operations having a direct impact on the erosion of the Si3N4 cap 16.

Simulations have been conducted using a specific software (e.g. Prolith available from FINLE TECHNOLOGIES) to determine the minimum oxynitride layer thickness to absorb all incident light, which has been found to be at least about 120 nm. On the other hand, the maximum film thickness is highly dependent on the product and the manufacturing process in consideration. In the present case, the selected value is about 200 nm.

A first advantage of oxynitride is to have an uniform thickness with a constant substrate reflectivity across the wafer because of its conformality. Another advantage is its capability to uniformly absorb all the light emitted during photo-exposure step. As a matter of fact, this material is substantially impervious to ultraviolet (UV) light and suppresses all substrate reflected light. The exposure related drawbacks mentioned above as standing waves in the photoresist lines are eliminated allowing better reproducibility. Thanks to this property, resist line profiles are not damaged and no "foot" at the Si3N4 layer 16' bottom is produced.

Still another advantage of oxynitride is that, as it is an inorganic material, less polymers or by-products are thus produced during the etching of layers 16' and 17'. Still another advantage of oxynitride results from its dielectric property (unlike the BARL). Therefore, it allows for more anisotropic etching, minimizing thereby the microloading effect. Finally, a better stability for the overall etch bias is obtained both in the dense and isolated areas. As a consequence, the GC stack 13 critical dimensions are improved from wafer to wafer and from lot to lot.

Now, referring to FIG. 2A, the oxynitride layer 17' is deposited in a plasma enhanced chemical vapor deposition (PECVD) reactor such as a Novellus Sequel C2, a tool manufactured by Novellus, San Jose, Calif., USA using a SiH4/N20/N2 chemistry. Adequate operating conditions are given below.

| | |
|---|---|
| SiH4 flow | 180 sccm |
| N2O flow | 350 sccm |
| N2 flow | 8000 sccm |
| Pressure | 2.6 Torr |
| Temperature | 450° C. |
| Power | 300 W |

The oxynitride layer 17' that will be subsequently used as a sacrificial film has a thickness of 200 nm, i.e. about twice the BARL layer 17 thickness, which allows for a significant thickness reduction of the Si3N4 layer 16' (230 nm instead of 410 nm for layer 16). Because parameter A" (700 nm) is now slightly smaller than parameter A' (770 nm), the aspect ratio AR is lowered, which is beneficial to the borderless metal contact fabrication process.

Figure 2B:
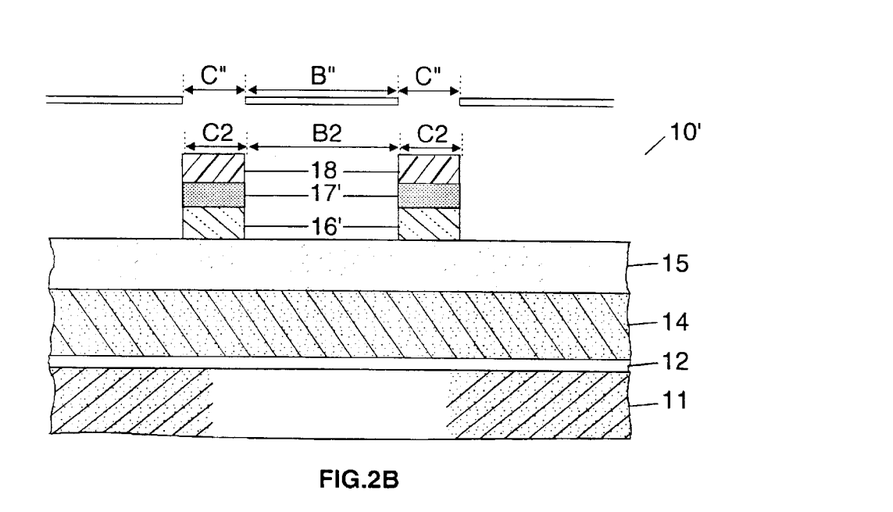

Now turning to FIG. 2B, the same processing as described above by reference to FIG. 1B applies, except for the duration as apparent from the operating conditions recited below.

| | |
|---|---|
| Ar flow | 16 sccm |
| CF4 flow | 120 sccm |
| CHF3 flow | 45 sccm |
| O2 flow | 7.5 sccm |
| Pressure | 160 mTorr |
| RF frequency | 13.56 Mhz |
| Power | 870 Watt |
| Magnetic Field | 30 Gauss |
| Duration | 60 s (oxynitride) |
| | 60 s (Si3N4) |

This process is monitored with an optical etch end point system as standard using the CN line (387.3 nm). The first step stops when the Si3N4 layer is detected and the second step is stopped when the underlying layer (WSix) is reached, in turn.

After performing this two-step etch, the resist is stripped in a FUSION tool, and the WSix of layer 15 is etched. For this last etch operation, oxynitride material of layer 17' is useful to create the sidewall passivating film referenced 24 in FIG. 2C. This particular passivation is based on SiO, SiN, . . . by-products coming from SixOyNz erosion. This passivation film 24 protects the WSix material of layer 15 from undercutting and notching effects in the tungsten grains during the subsequent etch of doped polysilicon layer 14. In addition, as the chemistry used is mainly based on Cl2 and HCl components, an overetching of the oxynitride layer 17' is induced. As during previous etch steps of layers 16' and 17', the overetch in the WSix layer 15 is the same in GC stacks 13' all across the wafer. This uniform etching is reproduced for the underlying layers 12 and 14.

Figure 2C:
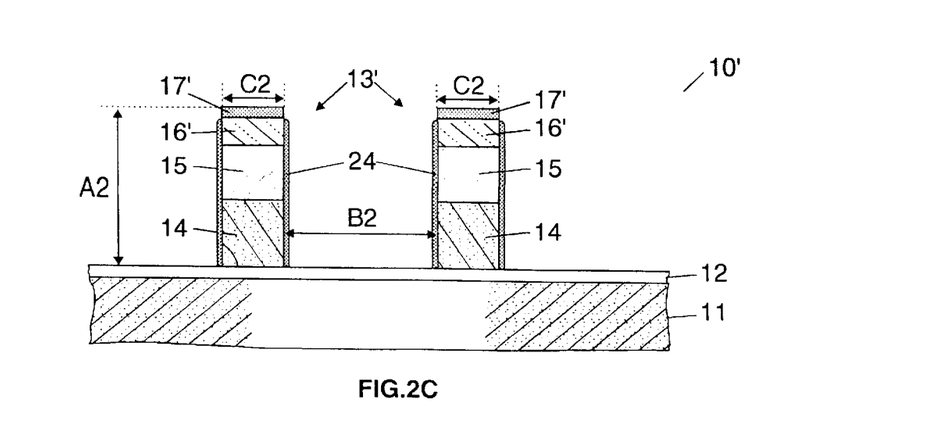

Therefore, the etch process described by reference to FIGS. 2B and 2C does not affect the GC stack 13' height measured by the A2 parameter which thus remains uniform all across the wafer. These two points, passivation brought about by film 24 and the absence of any mask erosion in oxynitride layer 17' permit better control of the critical dimensions of the GC stacks 13'. A cleaning operation (e.g. DHF in a wet bench) is performed to eliminate the SiOx residues deposited on the SiO2 gate layer 12 that were created during etching of polysilicon layer 14 and to strip passivation film 24 along the GC stacks 13'. After this cleaning step, parameter B2 indicates the width between two adjacent GC stacks 13'.

At this stage of the borderless contact fabrication process, very good reproducibility of the A2 and B2 parameters is obtained. Now, a conformal layer of dielectric such as Si3N4 is deposited onto the structure 10'. It is to be noted that other materials, e.g. oxynitride, could be used as well. Compounds such as Si3N4, oxynitride and the like have the property to be very conformal allowing to have the same thickness both on the top and sidewall of the GC stacks 13'.

Figure 2D:
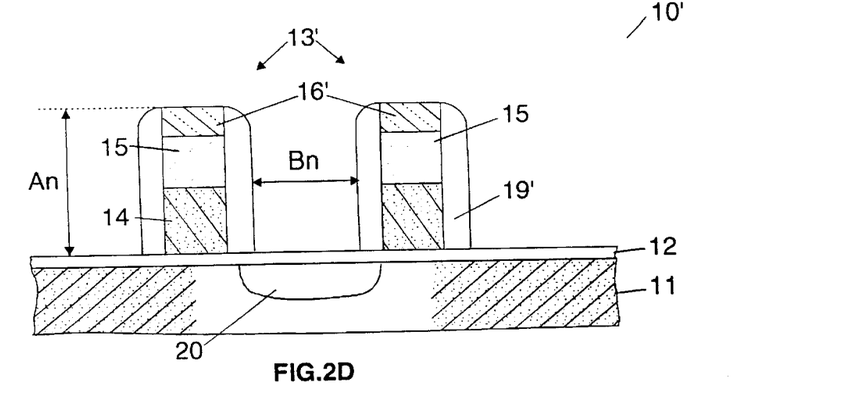
Figure 2E:
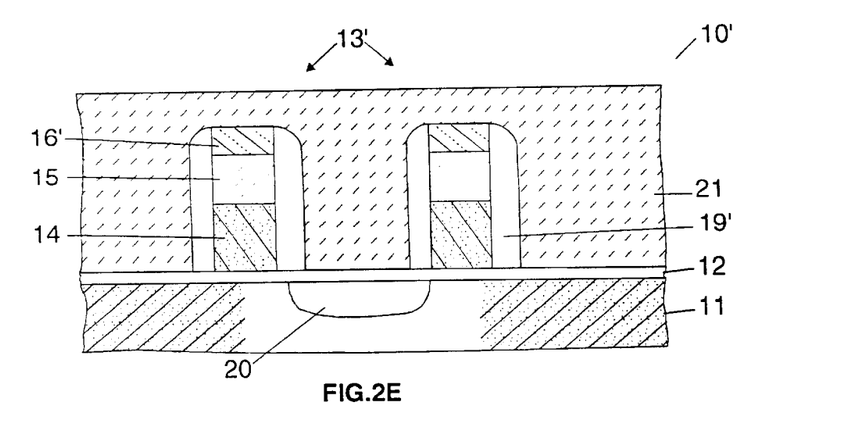

Now referring to FIG. 2D, the conformal dielectric layer is anisotropically etched to form spacers 19'. This etching may be done, for example, in an MxP chamber of an AME P5000 reactor, a tool manufactured by Applied Materials, Santa Clara, Calif., USA using a chemistry that is selective to the SiO2 material of gate layer 12 as described above. During this operation, the oxynitride of layer 17' is used as a screen, i.e. a hardmask, to protect the Si3N4 underlying layer 16'. Because, the materials of layers 16' and 17' have a slightly different stoichiometry and a selective chemistry is used, the hardmask 17' allows etching to reach the SiO2 gate dielectric layer 12 without damaging the Si3N4 cap 16'. During this etching, the material of the hardmask 17' is typically eroded, but not to the extent that would lead to a substantial reduction in the height of the Si3N4 cap 16'. This is another advantage of using a dielectric material as a sacrificial mask 17' during spacer fabrication, improving one more time the GC stack height uniformity all across the wafer without degrading the An parameter. According to the spacers 19' created around the GC stacks 13', the B2 parameter defined as the space between two adjacent GC stacks 13' is now reduced to the Bn parameter. As a result, spacers 19' have now a constant thickness unlike the spacers 19 etched according to the process described with reference to FIG. 1D. Another point is that parameters An and Bn now have the same value across the wafer. Following this step, some areas of the silicon substrate 11 are exposed to an ion beam, for example, to create the diffusion regions 20.

A thick layer of a passivation material, typically a boro-phospho-silicate glass (BPSG), is deposited onto structure 10' in order to fill the spaces between two GC stacks 13' without forming voids. Chemical-mechanical polishing is then performed as described above. As apparent in FIG. 2E, this operation reduces or eliminates a dishing effect, because the An parameter has a lower value and a greater reproducibility.

Figure 2F:
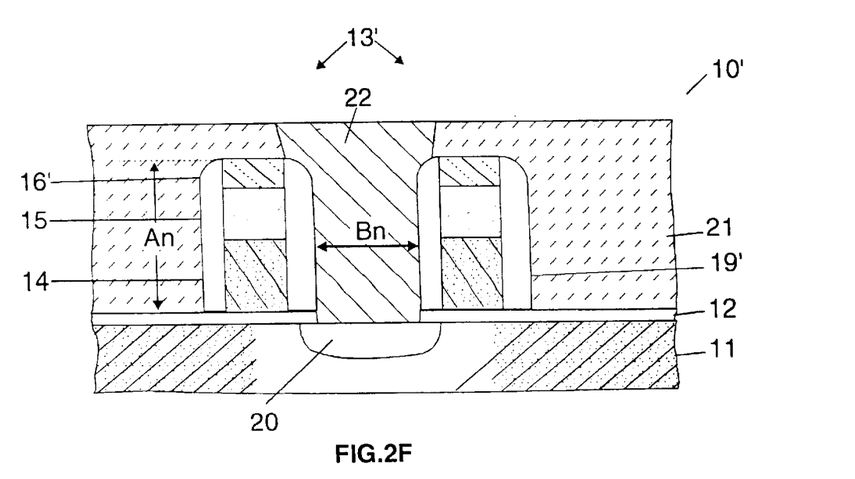

Finally, a refractory metal such as tungsten is used to fill contact openings to form metal contacts referenced 22 in FIG. 2F as described above by reference to the conventional fabrication process.

The table given below summarizes the evolution of aspect ratio parameters ARp and ARn (letters "p" and "n" stand for "prior art" and "new" respectively).

| PRIOR ART | | NEW PROCESS | |
|---|---|---|---|
| A' | 770 nm | A" | 700 nm |
| A1 | 630 nm | A2 | 580 nm |
| Ap | 570 nm | An | 570 nm |
| B' | Mask | B' | Mask |
| B1 | 400 nm | B2 | 440 nm |
| Bp | 280 nm | Bn | 320 nm |
| C | Dim. Mask | C | Dim. Mask |
| C 1 | 340 nm | C 2 | 320 nm |
| ARp (Ap/Bp) | 2.04 | ARn (An/Bn) | 1.78 |

The aspect ratio ARn=An/Bn is particularly important for the following metallization steps to form the so-called borderless metal contacts with diffusion regions 20. In this case, the aspect ratio is critical parameter, because the height of the GC stacks 13' (represented by the An parameter) and the width between two GC stacks (represented by the Bn parameter) are essential elements of the borderless metal contact fabrication process, when contact holes must be opened to expose diffusion regions 20 in substrate 11. Obviously, it is quite important to have a high reproducibility of the An parameter all across the wafer to avoid stopping the etch operation without totally attacking the SiO2 gate layer 12. In addition, such a high reproducibility avoids occurrence of electrical shorts between the wsix of the GC stacks 13' and the borderless metal (tungsten) contacts 22.

When a contact hole is opened on top of the GC stacks 13' thanks to the high reproducibility of the An parameter across the wafer, Si3N4 layer 16' integrity and thickness uniformity are essential in the formation of a reliable electrical contact with the WSix material.

It will be apparent to those skilled in the art that various modifications may be made in the process and products illustratively described therein, without departing from the spirit or scope of the invention as expressed in the following claims.

What is claimed is:

1. Method of fabricating a gate stack structure comprising:

providing a structure comprising a semiconductor substrate underlying a gate dielectric layer, a doped polysilicon layer, a refractory metal layer and a top silicon nitride capping layer in sequence, said refractory metal and doped polysilicon layers forming a polycide layer under subsequent thermal treatments;

depositing a layer of dielectric material onto said structure, said dielectric material being impervious to ultraviolet radiation and having a good conformal property;

photolithographically patterning said layer of dielectric material to form an in-situ hardmask;

using said in-situ hardmask, anisotropically etching said structure down to said semiconductor substrate to form a gate stack;

conformally depositing silicon nitride over said gate stack; and with said in-situ hardmask still in place, anisotropically etching said conformally deposited silicon nitride to form spacers on sidewalls of said gate stack.

2. The method of claim 1 wherein said dielectric material comprises silicon dioxide.

3. The method of claim 1 wherein said dielectric material consists essentially of silicon oxynitride.

4. The method of claim 3 wherein said layer of dielectric material is deposited to a thickness greater than 120 nm.

5. The method of claim 4 wherein said thickness is about 200 nm.

6. Method of fabricating a composite Si3N4/polycide structure laterally coated with a Si3N4 spacer having a lowered aspect ratio comprising:

a) providing a structure consisting of a silicon substrate coated with a bottom gate dielectric layer, a doped polysilicon layer, a refractory metal layer and a top Si3N4 capping layer; said refractory metal and doped polysilicon layers forming a polycide layer under subsequent thermal treatments;

b) depositing a sacrificial layer of a dielectric material onto the structure, said dielectric material being impervious to ultraviolet (UV) radiation and having a good conformal property;

c) depositing a layer of a photoresist material onto the structure;

d) patterning said photoresist layer to form a mask;

e) anisotropically dry etching to pattern the dielectric layer and top Si3N4 layers using the photoresist mask;

f) stripping the photoresist mask;

g) anisotropically dry etching the refractory metal and doped polysilicon layers down to the gate dielectric layer using the patterned dielectric layer as an in-situ hard mask;

h) depositing a conformal layer of Si3N4, referred to as a Si3N4 spacer layer, onto the structure;

i) anisotropically dry etching the Si3N4 spacer layer until the gate dielectric layer is exposed to form Si3N4 spacers;

j) introducing a dopant into the silicon substrate to create diffusion regions at desired locations;

k) depositing a layer of boro-phospho-silicate-glass (BPSG) onto the structure and planarizing it;

l) forming contact holes to expose said diffusion regions; and, m) filling said contact holes with a metal to create metal contacts with the diffusion regions.

7. The method of claim 6 wherein said dielectric material comprises oxynitride.

8. The method of claim 7 wherein said layer of dielectric material is deposited to a thickness greater than 120 nm.

9. The method of claim 8 wherein said thickness is about 200 rnm.

10. The method of claim 7 wherein said step e) of dry etching oxynitride is performed in a dry etcher with a CF4/CHF3/O2 chemistry.

* * * * *